United States Patent [19]
Martin et al.

[11] Patent Number: 6,043,642
[45] Date of Patent: Mar. 28, 2000

[54] WATT-HOUR METER WITH COMMUNICATION ON DIAGNOSTIC ERROR DETECTION

[75] Inventors: Warren T. Martin; William James Watson, both of Lafayette; Gregory A. Grisham, West Lafayette; Michael K. Anderson, West Lafayette; Randal K. Bond, West Lafayette, all of Ind.

[73] Assignee: Siemens Power Transmission & Distribution, Inc., Wendell, N.C.

[21] Appl. No.: 08/905,096

[22] Filed: Aug. 1, 1997

Related U.S. Application Data

[60] Provisional application No. 60/022,961, Aug. 1, 1996.

[51] Int. Cl.$^7$ .............................. G01R 7/00; G01R 11/63; G01R 5/22; G01R 1/38
[52] U.S. Cl. ..................... 324/142; 324/103 R; 324/104; 324/116
[58] Field of Search .............................. 324/142, 103 R, 324/116, 104

[56] References Cited

U.S. PATENT DOCUMENTS

| | | | |
|---|---|---|---|
| 3,937,890 | 2/1976 | Blethen | 179/2 A |
| 4,008,458 | 2/1977 | Wensley | 340/151 |
| 4,302,750 | 11/1981 | Wadhwani et al. | 340/870.02 |
| 4,315,251 | 2/1982 | Robinson et al. | 340/310 A |
| 4,345,311 | 8/1982 | Fielden | 324/142 |
| 4,442,492 | 4/1984 | Karlsson et al. | 364/464 |
| 4,455,453 | 6/1984 | Parasekvakos et al. | 179/2 AM |
| 4,509,128 | 4/1985 | Coppola et al. | 364/483 |
| 4,578,536 | 3/1986 | Oliver et al. | 179/2 AM |
| 4,697,182 | 9/1987 | Swanson | 340/870.02 |
| 4,707,852 | 11/1987 | Jahr et al. | 379/107 |
| 4,713,837 | 12/1987 | Gordon | 379/93 |
| 4,833,618 | 5/1989 | Verma et al. | 364/483 |
| 4,856,054 | 8/1989 | Smith | 379/107 |
| 4,884,021 | 11/1989 | Hammond et al. | 324/142 |
| 4,902,965 | 2/1990 | Bodrug et al. | 324/116 |
| 5,006,790 | 4/1991 | Beverly, II et al. | 324/142 |
| 5,056,107 | 10/1991 | Johnson et al. | 375/1 |
| 5,248,935 | 9/1993 | Sakoyama et al. | 324/142 |
| 5,381,462 | 1/1995 | Larson et al. | 379/107 |
| 5,448,229 | 9/1995 | Lee, Jr. | 340/870.02 |
| 5,469,049 | 11/1995 | Briese et al. | 324/76.77 |
| 5,473,322 | 12/1995 | Carney | 340/870.02 |
| 5,537,029 | 7/1996 | Hemminger et al. | 324/142 |
| 5,544,089 | 8/1996 | Hemminger et al. | 364/492 |
| 5,590,179 | 12/1996 | Shincovich et al. | 379/107 |
| 5,619,192 | 4/1997 | Ayala | 340/870.02 |
| 5,621,629 | 4/1997 | Hemminger et al. | 363/56 |
| 5,631,554 | 5/1997 | Briese et al. | 324/76.77 |

*Primary Examiner*—Josie Ballato
*Assistant Examiner*—Jermele M. Hollington

[57] ABSTRACT

An electrical utility meter includes measurement error diagnostic capabilities with intelligent communication capabilities. In an exemplary embodiment, the present invention includes an electrical utility meter for measuring energy consumption by a load. The electrical utility meter includes, sensor circuitry, a conversion circuit, a communication circuit, and a controller. The sensor circuitry connects to a meter socket. The meter socket connects to a plurality of power lines that, in turn, connect the load to a source of electrical power. The source of electrical power provides power to the load in a plurality of phases. The sensor circuitry generates voltage and current measurement signals representative of the voltage and current waveforms on the plurality of power lines. The conversion circuit is connected to the sensor circuitry and generates a power consumption measurement, as well as measured phase angle data for the plurality of phases, all of which are generated based on the voltage and current measurement signals. The communication circuit is connected to a remotely located control device. The controller is connected to the memory, the communication circuit, and the conversion circuit. The controller is operable to receive measured phase angle data for the plurality of phases, periodically perform a plurality of diagnostic tests using the measured phase angle data to determine whether a measurement error is present, and provide an alert signal to the communication circuit if a measurement error is present. The communication circuit, upon receiving the alert signal, is operable to obtain information identifying the measurement error and transmit an error signal containing information identifying the measurement error to remotely located control device.

30 Claims, 9 Drawing Sheets

WATT-HOUR METER WITH COMMUNICATION ON DIAGNOSTIC ERROR DETECTION

CROSS REFERENCE TO RELATED APPLICATION

This application claims the benefit of U.S. provisional patent application Ser. No. 60/022,961, filed Aug. 1, 1996.

FIELD OF THE INVENTION

The present invention relates generally to electrical utility meters, and in particular, electrical utility meters having diagnostic capabilities.

BACKGROUND OF THE INVENTION

Electrical utility service providers, or simply utilities, monitor energy usage by customers through electrical utility meters. Electrical utility meters track the amount of energy consumed, typically measured in kilowatt-hours ("kwh"), at each customer's facility. To this end, one or more electrical utility meters are connected to the power lines of a facility through a meter socket or similar arrangement. Utilities use the metergenerated consumption information primarily for billing, but also for resource allocation and other purposes.

Utilities generate polyphase electrical power, and typically, three phase power. Polyphase electrical power is alternating current electrical power that is supplied on a plurality of power supply lines, wherein the voltage waveform on each of the power supply lines has a unique phase angle with respect to others. Single family dwellings typically only use a single phase of the polyphase electrical power generated by the utility. By contrast, industrial, commercial, and multiple family dwellings generally use multiple phases.

Historically, electrical utility meters utilized an inductive spinning disk mechanism to measure energy consumption. In such meters, the rate at which the spinning disk rotated would vary proportionately to the amount of power being consumed. The spinning disk then drove mechanical counters that accumulated the energy consumption information.

A recent development in electrical utility meters are electronic meters. Electronic meter replace the older inductive or spinning disk meter design. Electronic meters rely on the digital sampling of the voltage and current waveforms on the power lines to generate energy consumption data. Electronic meters have several advantages, including the advantage of providing features beyond straightforward power consumption metering. For example, electronic meters may track energy demand, power factor, and per-phase power measurements. In addition, electronic meters may alter the method in which they calculate energy consumption in order to accommodate several building wiring and power configurations, thereby increasing the versatility of a single meter design.

A problem associated with electrical utility meters is inaccurate energy consumption measurements caused by improper installation or tampering. For example, improper installation can include situations in which the power lines are improperly wired to the meter socket. Improper wiring generally results in the meter measuring an inaccurate amount of energy consumption. However, such improper installation does not affect power service to the customer, and therefore goes unreported. Accordingly, the improper wiring error and resultant energy consumption measurement errors can go undetected for years. The inaccurate energy consumption measurements caused by the improper installation can result in large revenue loss for the utility.

Electronic meters have addressed this problem by incorporating fairly sophisticated diagnostics that detect measurement errors caused by improper installation and some forms of tampering. For example, U.S. Pat. No. 5,469,049 to Briese et al. shows a diagnostic toolbox that is built into a meter. The diagnostic toolbox in the Briese et al. device measures per phase voltage and current magnitude and phase angles. The measured voltage and current magnitude and phase angle values are compared to expected values to determine if one or more measurement errors are indicated.

According to Briese et al., certain codes are displayed on the meter display if an error is detected. The displayed code contains an identification of the error detected. The device disclosed in Briese et al. further displays the current and voltage magnitude and phase angle values upon request. Accordingly, the diagnostics of the Briese et al. meter provide for some detection of measurement errors that may result in loss of utility revenue.

A shortcoming of the device disclosed in Briese et al. is that it requires the physical presence of a utility field technician to obtain the error information. Specifically, the error information generated by the diagnostic toolbox is displayed on the meter display. Accordingly, it a customer or another party that is not related to the utility introduces a change in the wiring of the meter, then even if the meter detects the error, the utility will not be notified of the error until a utility field technician travels to and reads the meter.

For example, a party may tamper with the meter by rewiring the power line phases, thereby reducing the measured energy consumption. The utility may not visit the site for an extended period and therefore may not learn of the error, even thought the meter may display the error constantly. As a result, the utility may record and bill inaccurate energy consumption measurements for several months until a utility technician visits the site.

Accordingly there is a need for an electrical utility meter having an improved diagnostic capability that reduces the quantity of inaccurate measurements caused by improper wiring and tampering.

SUMMARY OF THE INVENTION

The present invention overcomes the above described shortcoming by incorporating sophisticated diagnostic capabilities with intelligent communication capabilities into an electrical utility meter. The electrical utility meter according to the invention is capable of identifying measurement errors typically associated with erroneous wiring or tampering and which result in inaccurate power consumption measurements. The meter is also capable of communicating information regarding the error information to a remotely located control device.

In an exemplary embodiment, the present invention includes an electrical utility meter for measuring energy consumption by a load. The electrical utility meter includes a sensor circuitry, a conversion circuit, a communication circuit, and a controller. The sensor circuitry connects to a plurality of power lines through a meter socket. The plurality of power lines connect the load to a source of electrical power which provides the load with electric power in a plurality of phases. The sensor circuitry generates voltage and current measurement signals representative of the voltage and current waveforms on the plurality of power lines. The conversion circuit is connected to the sensor circuitry and generates a power consumption measurement, as well as measured phase angle data for the plurality of phases, all of which are generated based on the voltage and current measurement signals. The communication circuit is connected to a remotely located control device. The controller is connected to the memory, the communication circuit, and the conversion circuit. The controller is operable to receive measured phase angle data for the plurality of phases, periodically perform a plurality of diagnostic tests using the measured phase angle data to determine whether a wiring error is present, and provide an alert signal to the communication circuit if a wiring error is present. The communication circuit, upon receiving the alert signal, is operable to obtain information identifying the wiring error and transmit an error signal containing information identifying the wiring error to remotely-located control device.

The remotely-located control device may suitably be a control computer or the like located at the utility's facilities. In such a case, the transmission of the error signal apprises the utility nearly immediately of any detected measurement error. The control device may also obtain other information from the meter that would verify that the measurement error is ongoing. The utility may then dispatch a technician to investigate the error, if warranted. As a result, the present invention reduces the likelihood that a wiring error or tampering situation will cause inaccurate power consumption measurements for an extended period of time.

The above features and advantages, as well as others, will become more readily apparent to those of ordinary skill in the art by reference to the following detailed description and accompanying drawings.

DETAILED DESCRIPTION

Figure 1:
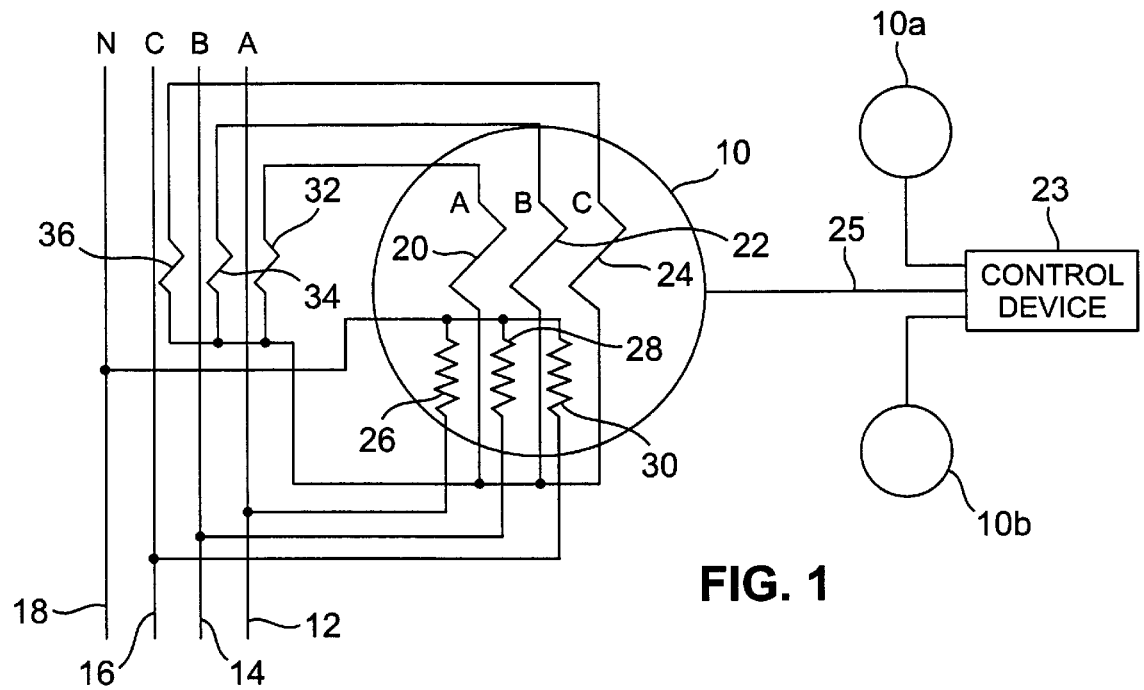
FIG. 1 shows an overview of an electrical utility meter according to the present invention wired for metering three phase electrical power service.

FIG. 1 shows an abstract overview of an electrical utility meter 10 according to the present invention that is connected to meter three phase electrical power service. Also shown in FIG. 1 is a remotely-located control device 23 which is connected to the meter 10 through a communication line 25.

To meter the electrical power service, the meter 10 is connected to a set of polyphase power lines that connect a source of electrical power, i.e., the utility, to the electrical system of an electrical service customer. The polyphase power lines include a phase A power line 12, a phase B power line 14, and a phase C power line 16.

The meter 10 also includes polyphase sensor means, and particularly, a phase A current sensor 20, a phase B current sensor 22, a phase C current sensor 24, a phase A voltage sensor 26, a phase B voltage sensor 28, and a phase C voltage sensor 30. The exemplary meter 10 is referred to as a transformer-rated meter. A transformer-rated meter is a meter having current sensors that connect to the power lines through scaling transformers external to the meter. To this end as shown in FIG. 1, first, second and third external scaling transformers 32, 34 and 36 respectively are situated in a current sensing relationship with the phase A, phase B and phase C power lines 12, 14, and 16, respectively.

The current sensors 20, 22, and 24, and the voltage sensors 26, 28, and 30, are all operably connected to the power lines 12, 14, 16 and the neutral line 18 through a meter socket, not shown. A meter socket is a physical device, well known in the art, which includes terminals that connect to the power lines 12, 14, 16 and the neutral line 18. The meter socket further includes terminals than connect to the first, second and third external scaling transformers 32, 34 and 36. The meter 10 is then installed into the meter socket to connect the polyphase sensor means to the appropriate terminals. The meter socket further provides a secure physical attachment of the meter 10 to a substantially permanent structure, such as a wall, beam, or the like, of the customer's facility. The meter 10 must be securely and ruggedly attached to ensure quality, continuous energy consumption measurements for billing purposes over long periods of time.

When the meter 10 is installed into the meter socket, the phase A current sensor 20 is connected to the first external scaling transformer 32, the phase B current sensor 22 is connected to the second external scaling transformer 34, and the phase C current sensor 24 is connected to the third external scaling transformer 36. In addition, the phase A voltage sensor 26 is connected between the phase A power line 12 and the neutral line 18, the phase B voltage sensor 28 is connected between the phase B power line 14 and the neutral line 18, and the phase C voltage sensor 30 is connected between the phase C power line 16 and the neutral line 18.

The meter 10 includes measurement circuitry, (shown in FIG. 3), that generates current and voltage information, as well as energy consumption information, from the currents and voltages detected by the voltage sensors 26, 28 and 30 and the current sensors 20, 22, and 24. The meter 10 further includes a diagnostic capability and a communication capability, as discussed further below.

The control device 23 is a computing device that is preferably connected to a plurality of meters, such as, for example, meters 10a and 10b, for the purpose of remotely monitoring the operation of the plurality meters. The control device 23 may suitably be located at a facility of the electrical utility. The communication line 25 may suitably be any communication line that incorporates a publicly switched telephone network, a private communication network, a wireless communication link, or any combination of thereof.

Figure 1A:
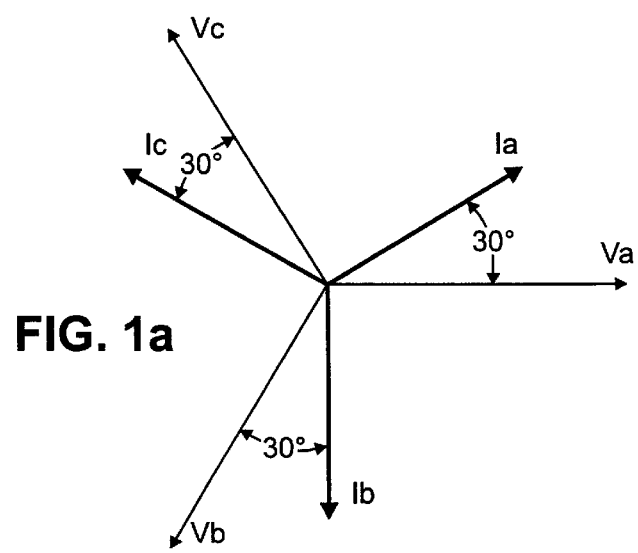
FIG. 1a shows a phasor diagram that illustrates the relationship between three exemplary phase voltages and currents in the meter wired as shown in FIG. 1.

FIG. 1a shows a phasor diagram that illustrates the relationship between three exemplary phase voltages and currents detected by the detection circuitry of the meter 10, as it is wired in FIG. 1. As illustrated, the exemplary phase voltages and phase currents exhibit a 30° lagging load. Typically, depending on the kind of service, the three voltage phases will typically be separated by a phase angle of approximately 120°, as will the three current phases. Each phase current and its corresponding phase voltage are typically separated by a relatively small angle, such as 30° as shown in FIG. 1a, and sometimes separated by no angle at all.

In operation, the meter 10 according to the present invention measures energy consumption as well as other electrical power consumption parameters using voltage and current measurements obtained by the current sensors 20, 22 and 24 and voltage sensors 26, 28, and 30. The meter 10 also uses its diagnostics capability to perform diagnostics, as described in further detail below in connection with FIGS. 5, 6, 7, 8 and 9, to determine if any measurement errors are present. A measurement error is an error that causes inaccurate power consumption readings. Measurement errors are often caused by the manner in which the meter 10 is connected to the power lines 12, 14, and 16. Typical measurement errors include voltage magnitude measurement errors, voltage angle measurement errors, current magnitude measurement errors and current angle measurement errors.

If, while performing diagnostics, the meter 10 detects a measurement error, then the meter 10 determines whether the error should be reported to the central computer. If the meter 10 determines that error should be reported, then the meter 10 uses its communications capability to communicate information identifying the error to the control device 23. The communication capability of the meter 10 is described in further detail below in connection with FIGS. 4 and 5.

In the exemplary configuration shown in FIG. 1, the meter 10 is appropriately connected to the power lines 12, 14, 16 and the neutral line 18, and therefore the diagnostic facility of the meter 10 does not detect a measurement error.

Figure 2:
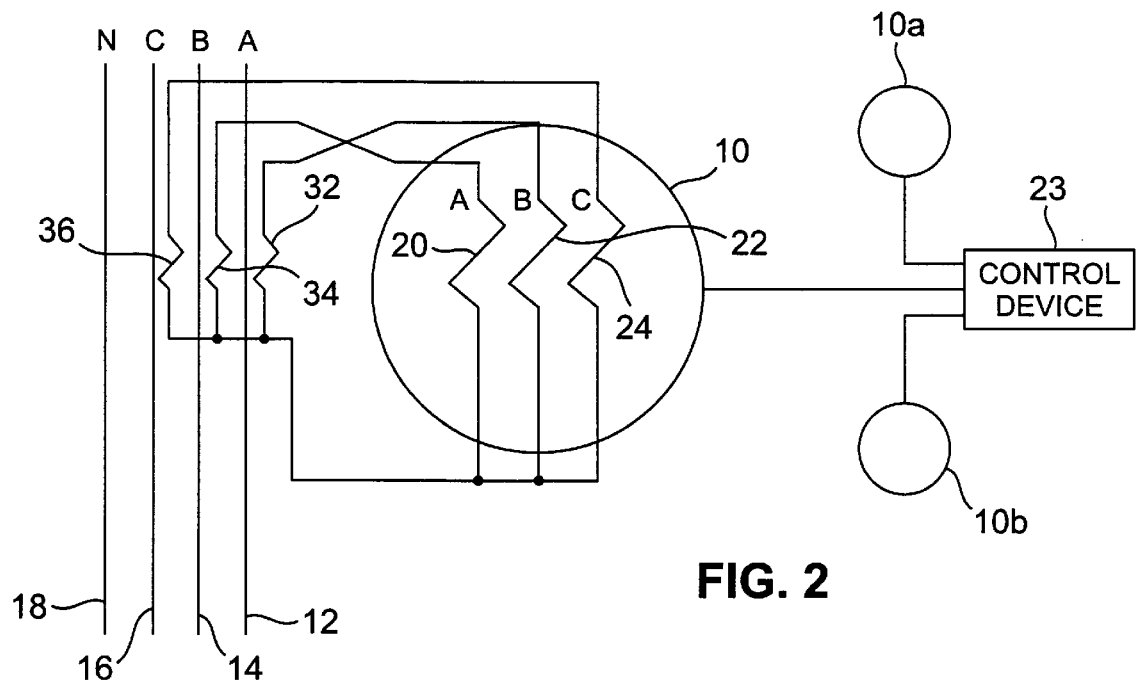
FIG. 2 shows an overview of an electrical utility meter according to the present invention wired for metering three phase electrical power service wherein a wiring error resulting in a measurement error is present.

By contrast, FIG. 2 shows the meter 10 of FIG. 1 connected to the power lines 12, 14, 16 and the neutral line 18 in such a manner that a wiring error, and specifically, a current cross-phasing error, exists. The wiring error causes a current angle measurement error in the meter 10. The current cross-phasing error is an error in which the current connections to the meter socket terminals have been interchanged for two phases. Because of the wiring error, the measurement circuitry in the meter 10 attempts to determine energy consumption using current measurement data for the wrong phases. The resulting energy consumption determination is substantially inaccurate.

Figure 2A:
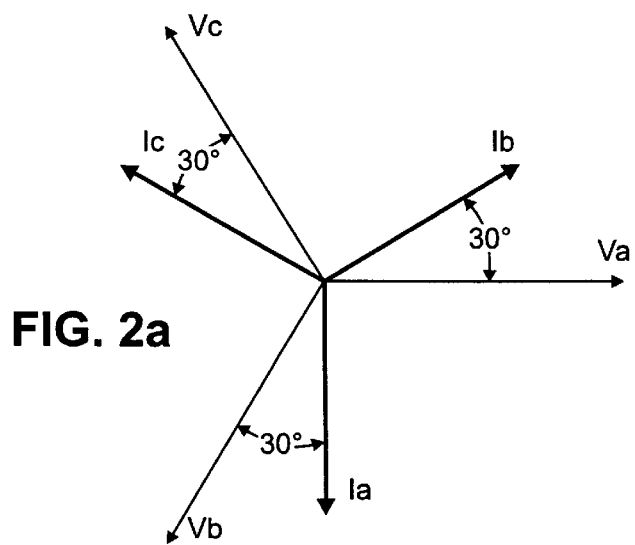
FIG. 2a shows a phasor diagram that illustrates the relationship between the three exemplary phase voltages and currents as measured by the meter wired as shown in FIG. 2.

Specifically, as shown in FIG. 2, the connection between the first external scaling transformer 32 and the phase A current sensor 20 has been juxtaposed with the connection between the second external scaling transformer 34 and the phase B current sensor 22. The result of this juxtaposition is that the measurement circuit of the meter 10 will process the phase A current as the phase B current, and vice versa. FIG. 2a shows a phasor diagram that illustrates the relationship between the exemplary phase voltages and currents of FIG. 1a as measured by the measurement circuit when the meter is wired as shown in FIG. 2.

Figure 8:
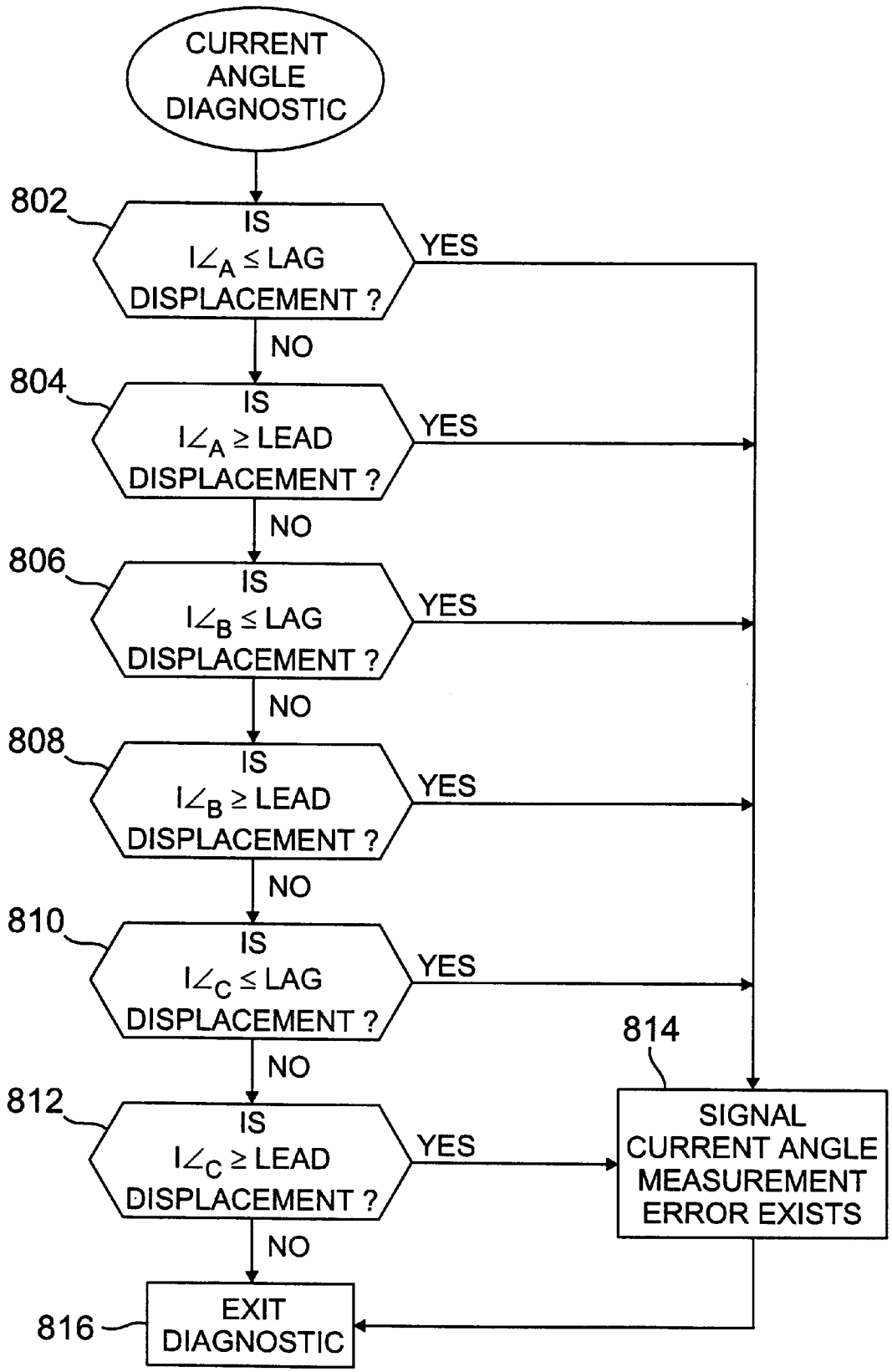
FIG. 8 shows a flow diagram of an exemplary current angle diagnostic performed by the controller of FIG. 4.

The meter 10, as described further below, detects the wiring error illustrated in FIGS. 2 and 2a during diagnostics. In particular, the meter 10 detects the current angle measurement error caused by the cross phasing wiring error during execution of a current angle diagnostic routine. An exemplary diagnostic routine that detects current angle measurement errors is illustrated in FIG. 8, discussed below.

Once a measurement error has been detected, the meter 10 determines whether to initiate communications with the control device 23 in order to convey the error information. The determination of whether to communicate the error information to the control device 23 is typically predetermined based on user-defined preferences. If it is determined that the error information is to be communicated to the control device 23, the communications capability of the meter 10 transmits the error information through the communications line 25 to the control device 23. Further detail regarding the communications capability of the meter 10 are discussed further below in connection with FIGS. 4 and 5.

Accordingly, the utility may remotely monitor the operation of the meter 10, as well as other meters having similar capabilities. Specifically, the utility may monitor those meters to determine if any revenue-depriving measurement errors are present, and if so, the identity of those errors. The utility may then use the information to determine whether and when to dispatch a technician to correct the error, or whether the customer's bill may be adjusted to recover the revenue lost due to the wiring error. The present invention thus provides an improvement over the prior art systems that merely display the type of error, and thus rely on the physical presence of a technician to identify the presence of revenue-losing errors.

Figure 3:
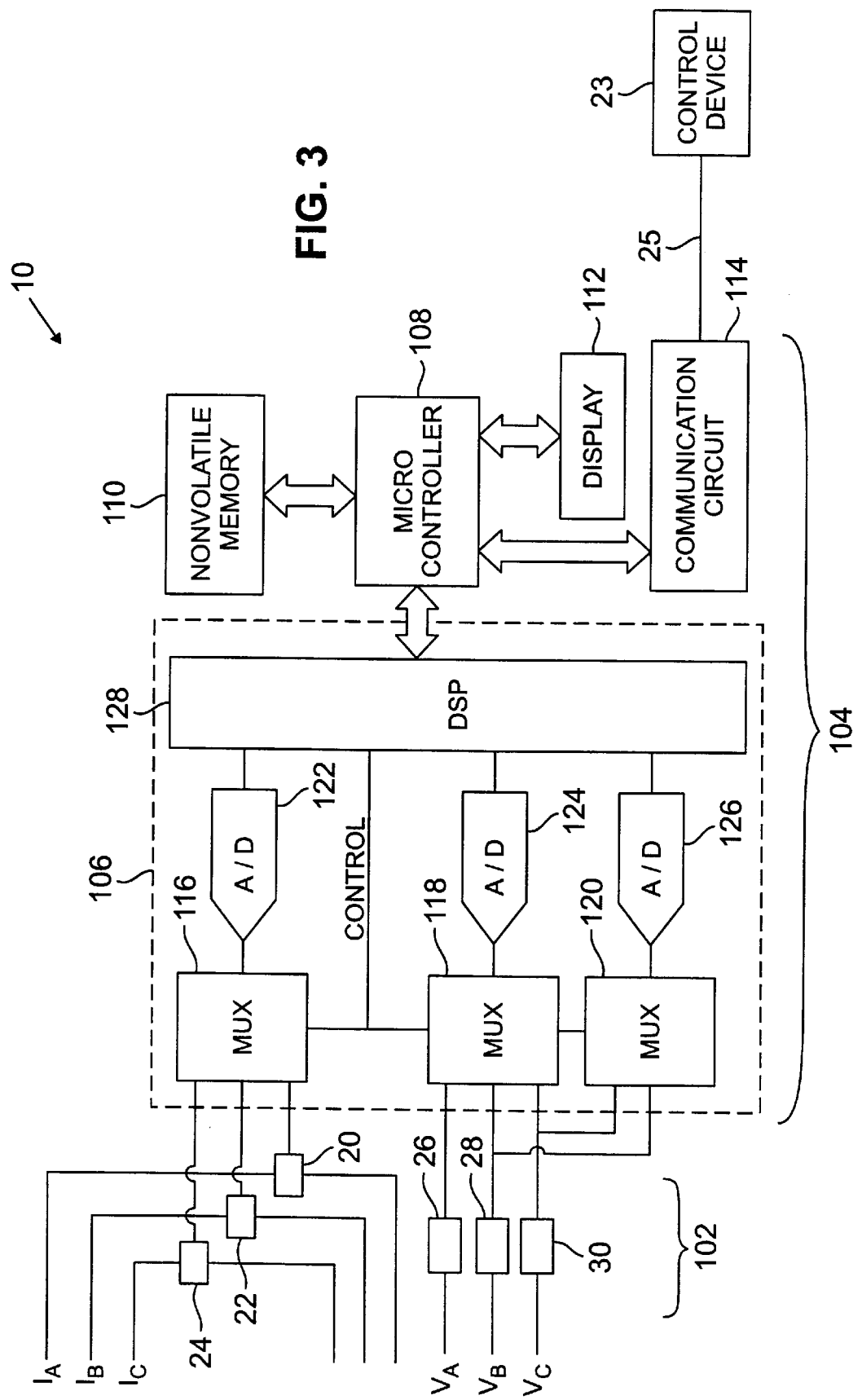
FIG. 3 shows a block diagram of an electrical utility meter according to the present invention.

FIG. 3 shows a block diagram of the electrical utility meter 10 according to the present invention. For purposes of clarity, elements of FIG. 3 are identified by the same reference numbers as like elements in FIG. 1. The meter 10 essentially comprises sensor circuitry 102 and detection circuitry 104. The sensor circuitry 102 includes a polyphase current sensor, and more particularly, the phase A current sensor 20, the phase B current sensor 22, and the phase C current sensor 24. The sensor circuitry 102 further includes a polyphase voltage sensor, and more particularly, the phase A voltage sensor 26, the phase B voltage sensor 28, and the phase C voltage sensor 30. The measurement circuit 104 further comprises a conversion circuit 106, a processor 108, a nonvolatile memory 110, a display 112, and a communication port 114.

The phase A current sensor 20 is connected to receive a signal indicative of the current waveform flowing through the phase A power line 12 (see FIG. 1). The phase A current sensor is further connected to the measurement circuit 104 through a first multiplexer 116. The phase A current sensor 20 may comprise a current transformer or any other device known in the art that detects current from the first external scaling transformer 32 and produces a signal indicative of the detected current waveform. The first multiplexer 116 is a part of the conversion circuit 106, discussed further below.

Similarly, the phase B current sensor 22 is connected to receive a signal indicative of the current waveform flowing through the phase B power line 14 (see FIG. 1). The phase B current sensor 22 is also connected to the measurement circuit 104 through the first multiplexer 116. Likewise, the phase C current sensor 24 is connected to receive a signal indicative of the current waveform flowing through the phase C power line 16 (see FIG. 1). The phase C current sensor 24 is likewise connected to the measurement circuit 104 through the first multiplexer 116. The phase B current sensor 22 and the phase C current sensor 24 preferably have the same structure as the phase A current sensor 20. In alternative embodiments, such as one that involves a self-contained meter, the current sensors 20, 22 and 24 are configured to measure the current waveform directly from the power lines 12, 14. and 16. In such an embodiment, the first, second, and third external scaling transformers 32, 34 and 36, respectively, would not be required.

Referring to the polyphase voltage sensor, the phase A voltage sensor 26 is typically connected directly to the phase A power line 12 (see FIG. 1) to obtain a voltage measurement therefrom. To this end, the phase A voltage sensor 26 may suitably comprise a high resistance voltage divider. The phase A voltage sensor 26 is further connected to the measurement circuit 104 through a second multiplexer 118. Like the first multiplexer 116, the second multiplexer 118 is a part of the conversion circuit 106 and is discussed further below. The phase B voltage sensor 28 is likewise connected to obtain a voltage measurement From the phase B power line 14, and is further connected to provide the voltage measurement to the second multiplexer 118. The phase C voltage sensor 30 has a similar structure and is connected to the phase C power line 16 and the multiplexer 118 in an analogous manner as the phase A voltage sensor 26 and the phase B voltage sensor 28.

The conversion circuit 106 is a circuit operable to receive polyphase voltage and polyphase current measurement signals and generate digital signals therefrom, the digital signals including a power consumption signal and voltage and current signals. In the exemplary embodiment described herein, the conversion circuit 106 comprises first, second and third multiplexers, 116, 118, and 120, respectively, first, second, and third analog to digital converters ("A/Ds") 122, 124 and 126, respectively, and a digital signal processor 128. The above listed components of the conversion circuit 106 may suitably be incorporated onto a single semiconductor substrate. An example of a suitable conversion circuit is the Power Measurement Integrated Circuit found in a model S4 electrical utility meters available from Landis & Gyr Utilities Services, Inc.

The controller 108 is operably configured to, and executes programming instructions to, receive the digital signals from the conversion circuit, monitor and record power consumption using the digital signals, and analyze the digital voltage measurement signals to determine whether one or more measurement errors is present. The controller 108 may suitably be a K0 series microcontroller available from NEC. The controller 108 generally includes firmware, or in other words, an integrated memory into which programming instructions are stored. Alternatively, the programming instructions may be stored in the nonvolatile memory 110.

The third multiplexer 120 and third A/D 126 provide additional capabilities to the meter 10 that are outside the scope of the present invention.

In operation, the phase A, B and C current sensors 20, 22, and 24, respectively, detect the phase A current, the phase B current, and the phase C current, and generate current measurement signals therefrom. The phase A current sensor A then provides the phase A current measurement signal to the first multiplexer 116, the phase B current sensor 22 provides the phase B current measurement signal to the first multiplexer 116, and the phase C current sensor 24 provides the phase C current measurement signal to the first multiplexer 116. The current measurement signals typically have a voltage level that is indicative of the instantaneous current level on their respective phases. For current transformers designed for utility meter use, the current measurement signals measure from 0.0 volts to 0.3 volts maximum. Other scaling factors may of course be employed.

The first multiplexer 116, under the control of the controller 108, then provides the instantaneous current measurement signal from one of the phase A, phase B, or phase C current measurement signals to the first A/D converter 122. The first multiplexer 116 typically provides each phase in rapid succession of cycles, such that each phase is provided to the first A/D converter 122 every third cycle. According to the exemplary embodiment described herein, the first multiplexer 116 provides the current measurement signals to the first A/D converter 122 at a rate of 3.3 kHz.

The first A/D converter 122 receives and samples or digitizes the rapid succession of instantaneous current measurement signals. The first A/D converter 122 then provides to the DSP 122 a stream of digital words, each representing the magnitude of one of the three phase currents at a particular instant.

Contemporaneously, the phase A, B and C voltage sensors 26, 28, and 30, respectively, detect the phase A voltage, the phase B voltage, and the phase C voltage, and generate voltage measurement signals therefrom. The phase A voltage sensor 26 provides the phase A voltage measurement signal to the second multiplexer 118, the phase B voltage sensor 28 provides the phase B voltage measurement signal to the second multiplexer 118, and the phase C voltage sensor 30 provides the phase C current measurement signal to the second multiplexer 116. Each voltage measurement signal is typically a signal having a voltage level that is indicative of the instantaneous voltage level on its respective phase. In the exemplary embodiment described herein, the voltage sensors are configured to provide voltage measurement signals that range from 0.0 volts to 0.3 volts maximum. Other scaling factors may of course be employed.

The second multiplexer 118 then provides each phase voltage measurement signal in a rapid succession of cycles, such that each phase is provided to the second A/D converter 124 every third cycle. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter wiring configuration, the first multiplexer 116 provides the phase x current measurement signal and the second multiplexer 118 provides the phase x voltage measurement signal contemporaneously, where x rotates among A, B and C.

The second A/D converter 124 receives and samples or digitizes the rapid succession of instantaneous voltage measurement signals. The second A/D converter 124 thus provides to the DSP 128 a stream of digital words or samples, each representing the magnitude of one of the three phase voltage measurement signals at a particular instant. The first A/D converter 122 and the second A/D converter 124 thus provide the digital voltage and current measurement signals in a predetermined synchronous phase relationship. The DSI 128 within the conversion circuit 106 the determines power consumption by selectively multiplying the digital voltage measurement signal samples and the digital current measurement signal samples received from the A/D converters 122 and 124, and then adding them together.

In particular, in a four wire wye meter wiring configuration, the appropriate power calculation is:

$$POWER = V_A I_A + V_B I_B + V_C I_C \quad (1)$$

The DSP 128 carries out the above calculation in the manner described herebelow. The DSP 128 receives from the A/D converters 122 and 124 a digital current measurement signal sample and a voltage measurement signal sample. The DSP 128 multiplies the received samples, and the resulting product is added to a running total or sum. The DSP 128 then receives the next set of digital current and voltage measurement signal samples and repeats the process. In other words, if $DIG\_VOLT_x$ is digital voltage measurement signal for a phase x and $DIG\_CURR_x$ is the digital current measurement signal for the phase x, then the DSP 128 carries out the following calculation:

$$POWER = SUM(DIG\_VOL_x * DIG\_CURR_x) \text{ for } x=\{A,B,C,A,B,\ldots\} \quad (2)$$

From time to time, the DSP provides power consumption data derived from POWER to the processor 108.

The processor 108 accumulates the power consumption data until a predefined watt-hour threshold has been reached. At that point, the processor 108 generates a power consumption pulse and increments a power consumption counter. The power consumption counter is the number by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The processor 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the case of a power interruption.

Optionally, the processor 108 further provides the power consumption counter information, as well as other information, to the communication port 114. The communication port 114 may then communicate the information over an external communication means, such as a public telephone network, to a central processing facility for the utility. In this manner, the utility may track and bill for power consumption registered by the meter 10 without requiring an employee to physically view the meter.

The processor 108 also generally controls the operation of the conversion circuit 106, and particularly, the first, second, and third multiplexers 116,118 and 120, respectively, the first, second, and third A/D converters 122, 124 and 126, respectively, and the digital signal processor 128.

In addition to metering energy consumption, the DSP 128 also determines and provides other information to the processor 108. In particular, the DSP 128 provides for each phase, the measured voltage magnitude and phase angle data, and the measured current magnitude and phase angle data.

To determine the measured voltage and current magnitude data, the DSP 128 performs an RMS calculation on each digital voltage and current measurement signal. This calculation may for example, include, for each phase voltage and current, squaring each sample of the digital measurement signal, and taking the mean of the squared samples over time.

To determine phase angles for each voltage, the DSP 128 uses the time differences between the zero crossings of the phase voltage signals. The time difference between the zero crossing of a particular signal $V_x$ and the $V_A$ signal, plus the direction of the respective zero crossings, provides the phase information. Current phase information is determined using watts per phase and VAR per phase. In particular, a current phase angle for phase x is given by arctan ($VAR_x/WATTS_x$).

The DSP 128 provides the measured voltage and current magnitude and phase angle data to the processor 108. Table 1, below shows the measured values so provided.

Table 1

$VRMS_A$=Phase A voltage magnitude $VRMS_B$=Phase B voltage magnitude $VRMS_C$=Phase C voltage magnitude $IRMS_A$=Phase A current magnitude $IRMS_B$=Phase B current magnitude $IRMS_C$=Phase C current magnitude $V<_A$=Phase A voltage phase angle $V<_B$=Phase B voltage phase angle $V<_C$=Phase C voltage phase angle $I<_A$=Phase A current phase angle $I<_B$=Phase B current phase angle $I=_C$=Phase C current phase angle It is noted that the processor 108 may be required to perform some further conversion on the measured data to put it in the form identified in Table 1.

Figure 4:
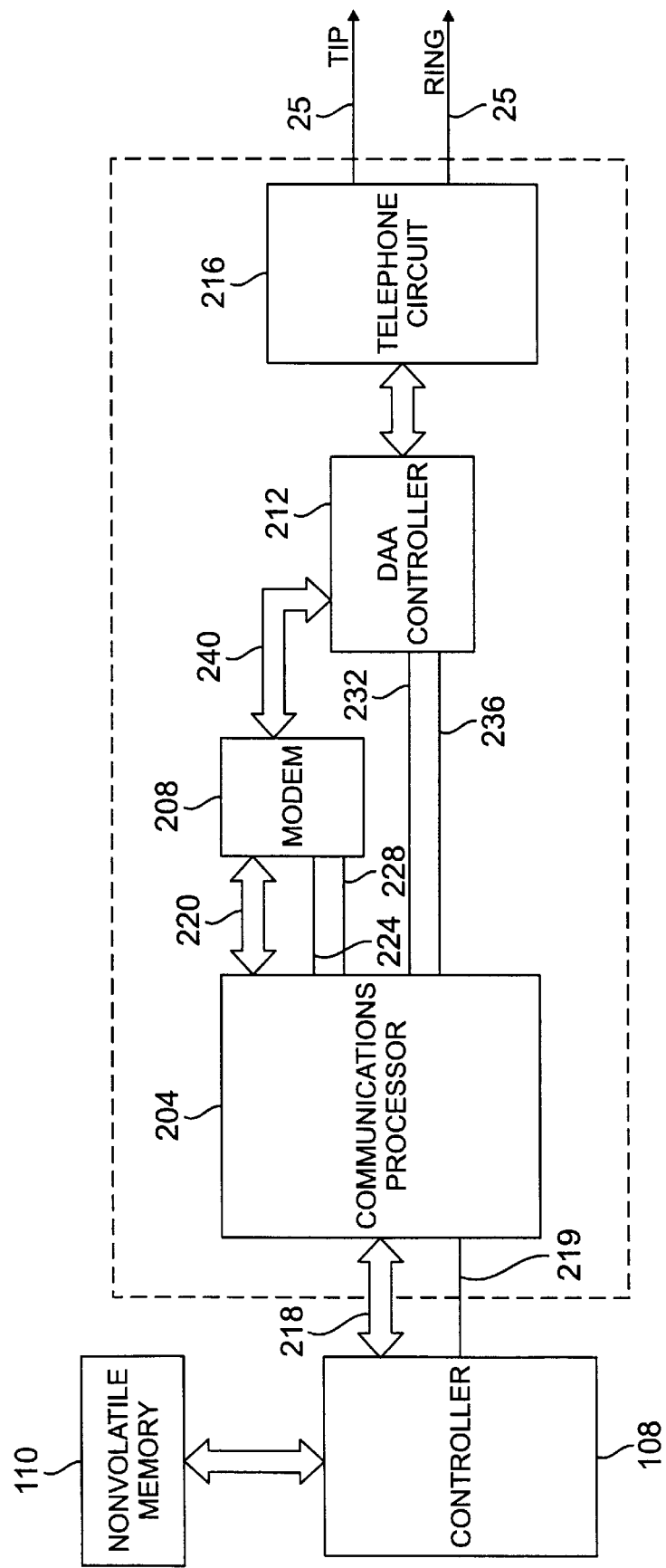
FIG. 4 shows a more detailed block diagram of the controller and communication circuit of the meter of FIG. 3.

FIG. 4 shows a more detailed block diagram of a portion of the meter 10 of FIG. 3. Specifically, FIG. 4 shows controller 108 and an exemplary embodiment of the communication circuit 114 of FIG. 3. The communication circuit 114 in the exemplary embodiment is operable to communicate via telephone lines, and includes a communication processor 204, a modem integrated circuit 208, a data access arrangement circuit ("DAA circuit") 212, and a telephone circuit 216.

The communication processor 204 in the exemplary embodiment is a microprocessor that is connected to the controller 108. The communication processor 204 is a circuit that controls the operations of the communication circuit 114 to facilitate the communication of data between meter 10 and the control device 23 in accordance with the present invention. The communication processor 204 may suitably be a P87C528 type processor available from Phillips Electronics of North America. The communication processor 204 is connected to the controller 108 through a plurality of data lines 218 and an alert line 219. The communication processor 204 is further connected to the modem IC 208 through a data connection 220, an upstream status line 224, and a downstream control line 228.

The communication processor 204 is further connected to the DAA circuit 212 through, among other things, an upstream status line 232 and a downstream control line 236. The communication processor 204 includes other connections to the modem IC 208, the DAA circuit 212, the controller 108 and other devices, not shown, the details and nature of which would be well known to those of ordinary skill in the art.

The modem IC 208 in the exemplary embodiment is a modem circuit that sets up control registers for call signaling and performs timing synchronization between the communications microprocessor 204 and the DAA circuit 212. To this end, the modem IC 208 is connected to the DAA circuit 212 through, among other things, data lines 240. The modem IC 208 may suitably be a 2400 baud modem, integrated circuit number 73K224L-28H, available from SSI, of Tustin, Calif.

The DAA circuit 212 is a type of circuit well known in the art that converts the between the serial digital signals used by the modem IC 208 and the analog signals used by the communication line 25. In the embodiment described herein, the communication line 25 is a telephone line and the DAA circuit 212 is operable to convert between analog telephone line signals and serial digital signals. For this embodiment, the DAA circuit 212 is further operably connected to a telephone circuit 216 that performs ring detection, isolation, hook switch, and other telephony functions. The details of the configuration and operation of the modem IC 208, the DAA circuit 212 and the telephone circuit 216 to effectuate communications between the communication processor 204 and the telephonic communication line 25 is well known to those of ordinary skill in the art.

Moreover, it will be noted that the modem IC 208, the DAA circuit 212, and the telephone circuit 216 are given by way of example only. Those of ordinary skill in the art may readily substitute other circuits that communicate data between the communication processor 204 and a remote control device. Such devices are well known and may include wireless transmission media, optical fiber transmission media, and the like.

Figure 5:
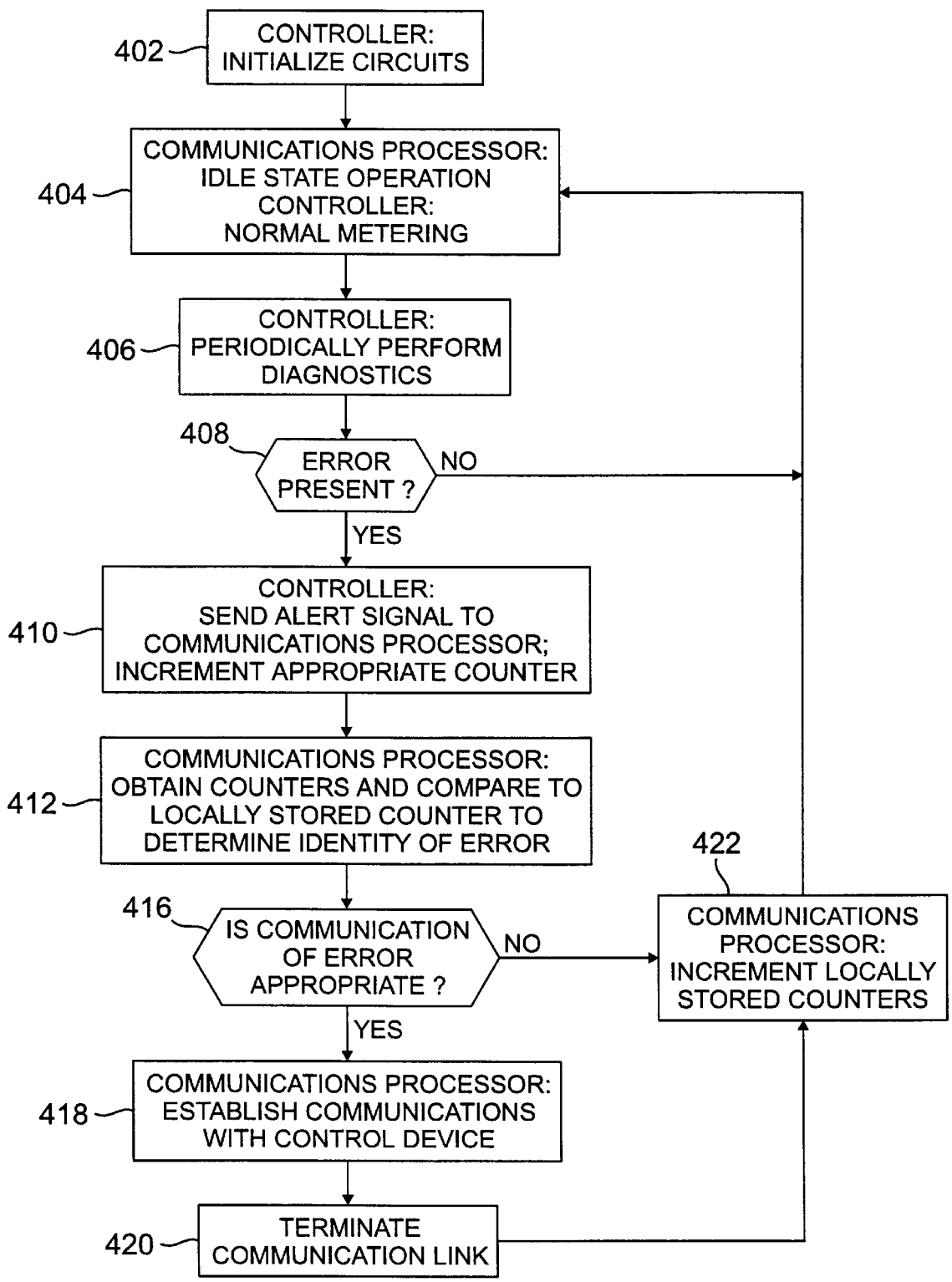
FIG. 5 shows a block diagram of the operations of the controller and communication circuit of FIG. 4 in accordance with the present invention.

FIG. 5 shows a flow diagram of the operations performed by the elements of FIG. 4 to identify and communicate wiring errors in the meter 10. Specifically, FIG. 5 shows the operations in which the controller 108 of FIG. 4 detects and identifies a measurement error, and in which the communication circuit 114 obtains the error information and transmits the information over the communication line 25. The discussion of the flow diagram in FIG. 5 will simultaneously refer to the elements of FIG. 4.

When the meter 10 of FIG. 3 is first connected, the controller 108 oversees the initialization of the components of FIG. 4 (step 402). As part of the initialization process, the controller 108 obtains from the nonvolatile memory 110 the counters for a plurality of measurement errors, and provides the counter data to the communication processor 204. To this end, the controller 108 maintains a counter in the nonvolatile memory 110 for each of a plurality of measurement errors. As will be discussed further below, whenever a measurement error is detected, the controller 108 increments the counter associated with that particular measurement error. Referring again to step 402, the controller 108 downloads the existing counter values to the communication processor 204, which in turn stores the values in local memory, such as an associated RAM or the like, not shown.

After initialization, the communication processor 204 goes into an idle state while the controller 108 performs the ordinary metering functions, such as energy consumption measurement as described above in connection with FIG. 2 (step 404). Periodically, the controller executes one or more diagnostic routines that detect whether a measurement error is present (step 406). FIGS. 6 through 9 each show a diagnostic routine directed toward detecting one of a set of measurement errors. Accordingly, execution of step 406 typically involves the execution of one or more of the flow diagrams illustrated in FIGS. 6 through 9.

Once the diagnostic routines are completed, the controller 108 branches to one of two steps depending on whether a measurement error is detected (step 408). If an error is detected in step 406, then the controller 108 proceeds to step 410. If not, the controller 108 returns to the normal metering functions (step 404).

In step 410, the controller 108 increments the appropriate measurement error counter(s) and generates an alert signal. The controller 108 sends the alert signal over the alert line 219 to the communication processor 204, which causes the communication processor 204 to enter an active state. The controller 108 furthermore increments the appropriate measurement error counter(s) based on the identity of the detected measurement error or errors. To this end, the appropriate counter or counters are retrieved from the nonvolatile memory 110, incremented, and then re-stored in the nonvolatile memory 110. For example, if a voltage angle measurement error was detected in step 406, then the controller 108 increments the counter associated with the voltage angle measurement error.

After receiving the alert signal in step 410, the communication processor 204 retrieves the measurement error counters from the non-volatile memory 110 to determine which of the counter values have changed (step 412).

In some cases, the controller 108 may initiate communications for reasons other than the detection of a measurement error, such as to alert the utility of a power failure or simply to report energy consumption. Such features are well known in the art and are not discussed herein in detail. In such a case, the communication processor 204 in step 412 may also first determine weather a measurement error has occurred. If a measurement error has not occurred, then the communication circuit 114 effectuates communication as is well known in the art to accomplish the desired communication. If an error has occurred, then the communications processor proceeds as illustrated in FIG. 5.

In step 412, the communication processor 204 determines the identity of the measurement error by comparing the counters stored in the nonvolatile memory 110 with the counters stored locally in the memory associated with the communications processor 204. The identity of the detected measurement error is the measurement error for which the counter in the nonvolatile memory 110 does not equal the counter stored locally in the memory associated with the communication processor 204. To retrieve the counter values from the nonvolatile memory 110, the communication processor 204 typically accesses the nonvolatile memory 110 via the controller 108.

After step 412, the communication processor 204 determines whether the measurement error is one for which communication with the control device is proper (step 416). To this end, a user may program parameters into the meter 10, specifically the nonvolatile memory 110, identifying those measurement errors for which communication with the control device 25 should be made. By allowing the user to define which measurement errors require communication to the control device, the user may custom configure the meter 10 to communicate only those errors the utility determines to be serious enough to require immediate notification.

For example, a particular user may require that the meter 10 communicate with the control device 23 only on the occurrence of voltage angle measurement errors and voltage magnitude measurement errors. Accordingly, if a current magnitude error is detected, then the communication processor 204 in step 416 would determine that communication with the control device is not appropriate.

In any event, if according to the predefined parameters, communication is not appropriate, then the communication processor 204 updates the locally-stored counters corresponding to the measurement errors determined to be present (Step 422). The communication processor 204 then returns to its idle state and the controller resumes normal metering operations (step 404). Alternatively, the controller 108 may take corrective action by adjusting the operation of the conversion circuit 106 of FIG. 3 to compensate for the detected measurement error. Such a capability is described in an United States patent application Express Mail No. EM336397159US, filed Jun. 24, 1997, which is assigned to the assignee of the present invention, and which is incorporated herein by reference. After the corrective action, the controller 108 would in any event return to normal metering operations (step 404).

If, however, it is determined in step 416 that communication of the measurement error information is appropriate, then the communication processor 204 controls the operations of modem IC 208 and the DAA circuit 212 to establish communications over the communication line 25. To this end, the communication processor 204 uses control lines 228 and 236 to control the modem IC 208 and the DAA circuit 212, respectively, and furthermore monitors their status through status lines 224 and 232 respectively.

The DAA circuit 212 operates in conjunction with the telephone circuit 216 to establish a modem connection over the communication line 23 to the remotely located control device 23 (See FIGS. 1, 2 and 3). Once proper handshaking is accomplished, the communication processor 204 generates one or more initial transmission packet that includes information identifying the meter 10 and the reasons for the communication, which may include information identifying the measurement error. The modem IC 208 receives the packet information and adds an overhead layer, and then provides the information to the DAA circuit 212 in accordance with proper timing requirements. The DAA circuit 212 modulates the received packet information, which is in digital form when received from the modem IC 208, onto the communication line 25.

Upon receiving the information, the control device 23 typically sends a read message requesting to read the meter data information. The meter data requested may include per phase rms voltage and current values, current and voltage phase angle values, and per phase VA and VAR. The read request message is first received by telephone circuit 216 and then the DAA circuit 212. The DAA circuit converts the read request message from an analog telephone signal to a serial digital signal. The DAA circuit 212 provides the serial digital signal to the modem IC 208 which then further processes the read request message to produce a data signal appropriate for processing by the communication processor 204.

The communication processor 204, upon receiving the data signal containing the read request message from the control device 23, controls the transfer of the requested meter data between the controller 108 and/or nonvolatile memory 110 and the control device 23 (see FIGS. 1, 2, and 3). The communication processor 204 may also, if not done so in the initial transmission packet, provide the identity of the measurement error. The communication circuit 114 transmits the meter data in the same manner as it transmitted the initial transmission packet.

A user located at the facility containing the control device 23 may then read the meter data and compare the various quantities in the meter data to the identified measurement error. The user may then evaluate the situation based on the meter data and determine what, if any, action should be taken. For example, if a measurement error is reported by the meter 10, but the transmitted meter data indicates that the error is no longer present, the user or technician at the control device 23 may elect not to dispatch a technician to investigate. If, however, the meter data confirms the reported measurement error, then the user may decide that corrective action is needed.

Moreover, if the meter 10 contains the error compensation capability such as that described in U.S. patent application Express Mail No. EM336397159US, discussed above, then the meter data may confirm to the user at the control device 23 that the error compensation capability of the meter adequately corrected the measurement error. If the comparison of the meter data and the detected measurement error indicates that the compensation did not adequately correct for the measurement error, then the user may then take appropriate action.

In any event, once communications with the control device 23 are completed, the communication link is terminated (step 420). The communication processor 204 then updates it locally-stored counters as discussed above (step 422). The communication processor 204 then returns to its idle state and the controller 108 resumes normal metering operations (step 404).

Accordingly, the present invention provides significant time and labor saving features by providing a meter that is capable of detecting and identifying one of several measurement errors and communicating that information to a remotely located control device. A utility may use the control device to monitor the operations of several meters from a single location. The ability of the meters to communicate the identity of the errors and other information upon detection of a measurement error apprises the utility of the presence of measurement errors in a timely manner. As a consequence, the utility may quickly analyze and react to such errors, thereby reducing revenue loss. Moreover, the provision of information both identifying the detected measurement error and the actual meter data allows the utility to evaluate whether immediate corrective action must be taken. Such evaluation saves labor costs associated with dispatching a technician for a spurious or temporary error.

FIGS. 6 through 9 show flow diagrams for four exemplary measurement error diagnostic routines that may be performed by a meter according to the present invention. In particular, FIGS. 6 through 9 show flow diagrams executed by the controller 108 in step 406 of FIG. 5. In the normal operation of the meter, step 406 is performed relatively frequently, for example, every second. Any, all, or any combination of all of the flow diagrams of FIGS. 6 through 9, as well as other diagnostic routines known in the art, may be performed at each execution of step 406. As described above in connection with FIG. 5, the detection of any or all of these measurement errors may trigger the communication circuit 114 to notify the control device 23.

Figure 6:
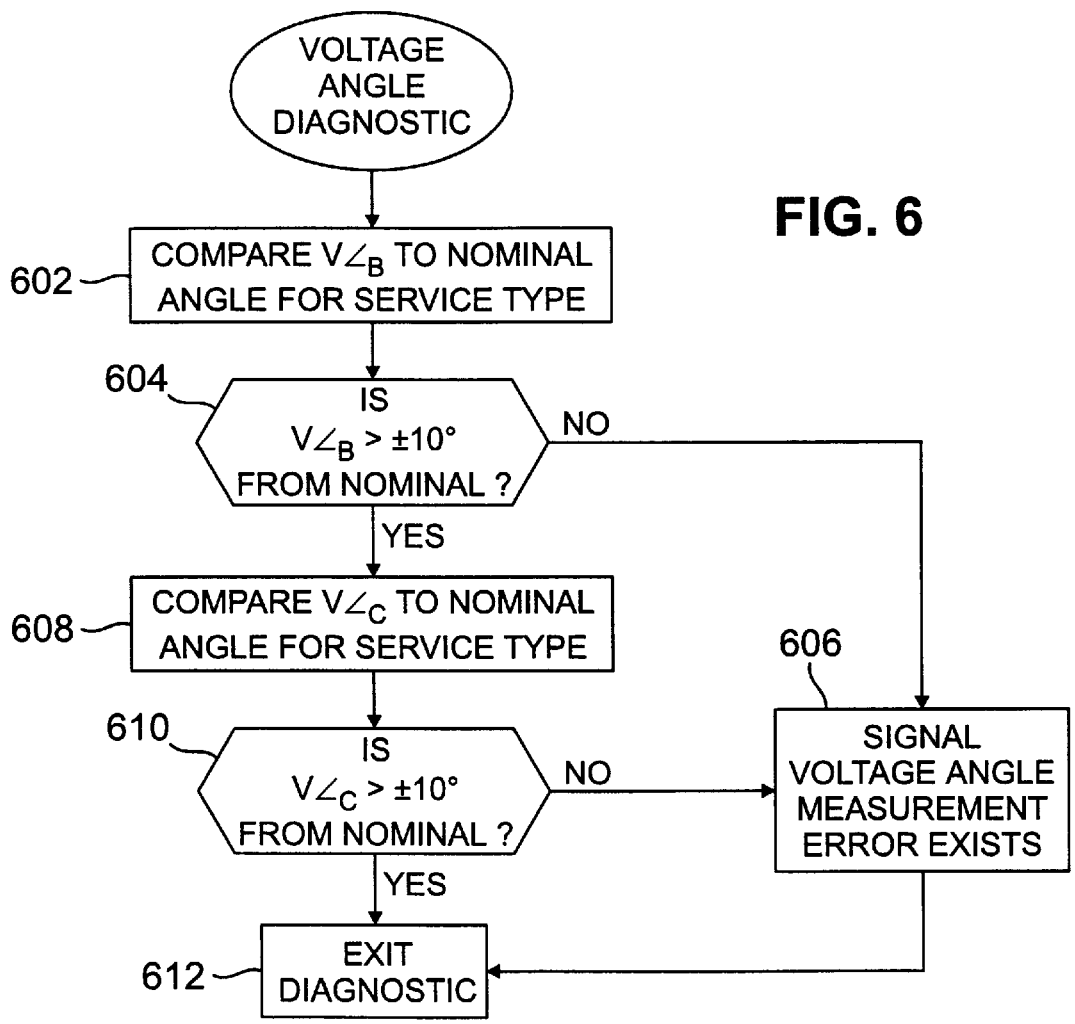
FIG. 6 shows a flow diagram of a voltage angle diagnostic performed by the controller of FIG. 4.

FIG. 6 shows a flow diagram of steps performed by the controller 108 to carry out a voltage angle diagnostic. A voltage angle diagnostic determines whether one of the voltage phase angles is not within expected ranges. If a voltage phase angle is outside of its expected range, then a voltage angle measurement error exists.

A voltage angle measurement error may be caused, for example, by improper wiring of the meter socket. For example, if in a three phase voltage electrical system, the phase B power line is wired to the phase C voltage sensor on the meter, and the phase C power line voltage is wired to phase B voltage sensor on the meter, then the meter would show the phase B and C voltages to have incorrect phase angles. Voltage angle measurement errors typically under-report energy consumption and thus cause a loss of revenue to the utility.

In the voltage angle diagnostic, the controller 108 first compares $V<_B$ to the expected or nominal phase B voltage phase angle (step 602). For example, in a four wire wye service type, the expected phase B voltage phase angle is 120°. The controller 108 obtains the measured $V<_B$ as described above in connection with FIG. 3. The nominal phase B voltage phase angle, as well as other nominal or expected voltage and current angles, are stored in the non-volatile memory 110. If the controller determines that $V<_B$ is not within ±10° from the nominal phase B voltage phase angle (step 604), then the controller 108 sets a flag or signal that a voltage angle measurement error exists (step 606). Referring to FIG. 5, the controller 108 refers to that signal or flag in steps 408 and 410, in which the error is logged in its appropriate counter. Referring again to FIG. 6, after step 606, the controller 108 exits the diagnostic (step 612).

If the controller 108 determines in step 604 that $V<_B$ is within ±10° from the nominal value, then the controller 108 proceeds to compare $V<_C$ to its nominal value (step 608). After performing step 608, the controller 108 determines whether $V<_C$ is within ±10° of its nominal value. If not, then the controller 108 determines that a voltage angle measurement error exists and proceeds to execute step 606 as discussed above. If, however, $V<_C$ is within ±10° of its nominal or expected value, then the controller exits the diagnostic (step 612), having determined that no error is present.

It is noted that the controller 108 does not check $V<_A$ because $V<_A$ is always defined as the reference angle, 0°. Nevertheless, if the phase A line voltage is wired to the meter 10 incorrectly, the measurement error will appear at either in step 604, 610, or both.

Figure 7:
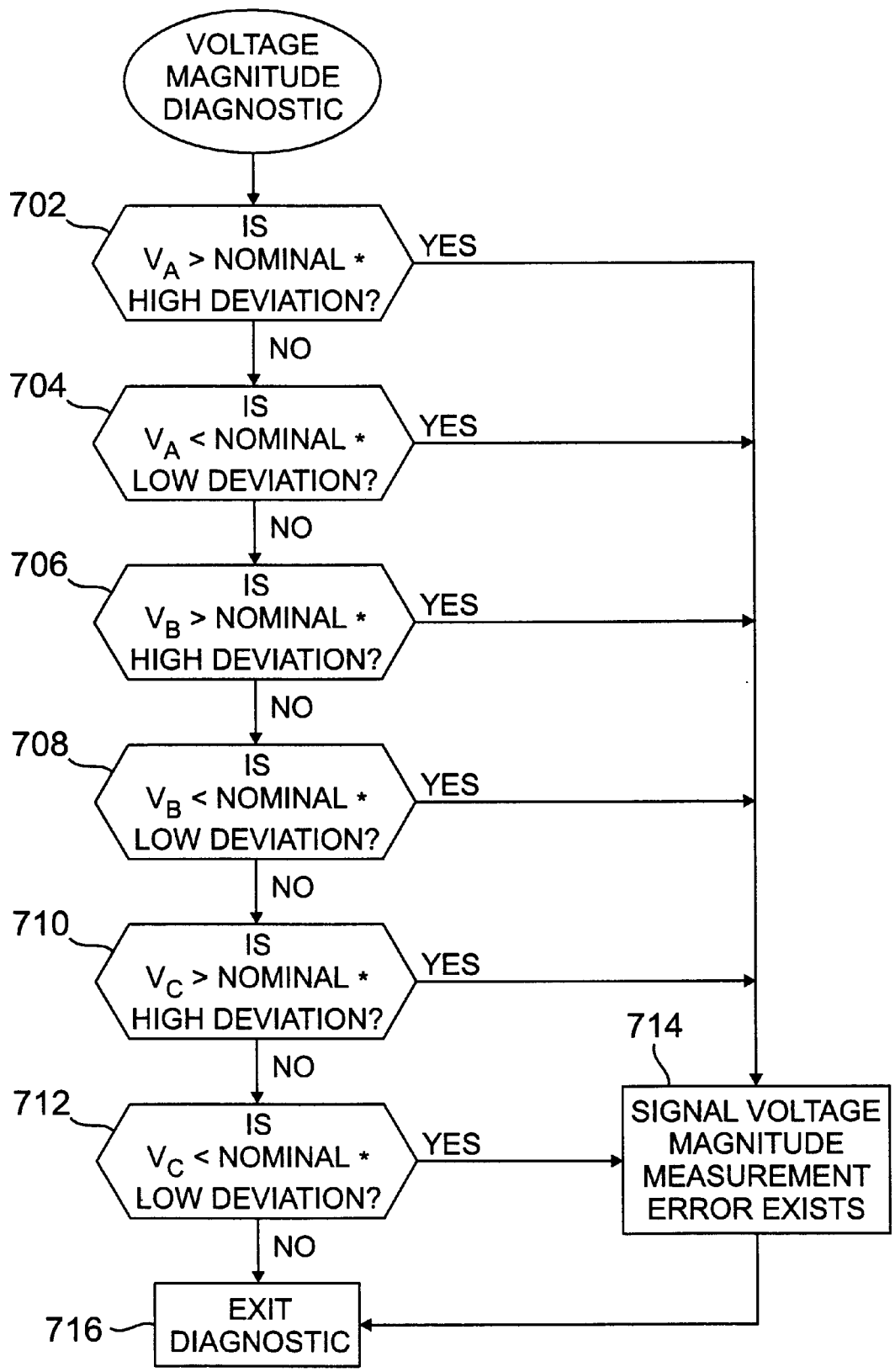
FIG. 7 shows a flow diagram of an exemplary voltage magnitude diagnostic performed by the controller of FIG. 4.

FIG. 7 shows a flow diagram of steps performed by the controller 108 to carry out a voltage magnitude diagnostic. A voltage magnitude diagnostic determines whether one of the voltage magnitudes is not within expected ranges. If a voltage magnitude is outside of its expected range, then a voltage magnitude measurement error exists.

A voltage magnitude measurement error may be caused by improper meter wiring or tampering. For example, one method of meter tampering is to introduce a voltage divider onto one or more of the voltage sensors in the meter. The result of the tampering is that the affected phase voltage or voltages would have a much lower magnitude than would be expected for the line voltage. The lower voltage magnitude reduces the measured energy consumption, resulting in a loss of revenue for the utility.

To performing the voltage magnitude diagnostic, the controller 108 determines whether each phase voltage is within an acceptable deviation from the expected or nominal value. To this end, the controller 108 uses deviation factors, HIGH DEVIATION and LOW DEVIATION, which are numbers that when multiplied by the nominal value, yield the maximum acceptable phase voltage magnitude and the minimum acceptable phase voltage magnitude, respectively. For example, HIGH DEVIATION may be 1.05, while LOW DEVIATION may be 0.95.

In particular, as shown in FIG. 7, the controller 108 determines, in order: whether $VRMS_A$ is within acceptable variation from the nominal value (steps 702 and 704); whether $VRMS_B$ is within acceptable variation from the nominal value (steps 706 and 708); and whether $V_IMS_C$ is within acceptable variation from the nominal value (steps 710 and 712). If, in any of the steps 702, 704, 706, 708, 710, or 712, the controller determines that a measured voltage magnitude is not within acceptable variation from the nominal value, then the controller 108 proceeds to step 714. Otherwise, if the controller 108 determines that all measured voltage magnitude values are acceptable, the controller exits the diagnostic (step 716).

In step 714, the controller sets a flag or signal that indicates that a voltage magnitude measurement error exists. The controller 108 then exits the diagnostic (step 716).

FIG. 8 shows a flow diagram of steps performed by the controller 108 to carry out a current angle diagnostic. A current angle diagnostic determines whether one of the current angles is not within expected ranges, or in other words, whether a current angle measurement error exists. While under normal conditions the current angles may vary extensively depending on the impedance of the load being metered, there are nevertheless limits to the acceptable amount of variation from the nominal current angle for each phase. The existence of current angles outside the acceptable range usually indicates a wiring error, such as the cross phase error illustrated in FIG. 2, above, in which the current sensor of one phase is wired to measure current of another phase. Current angle measurement errors typically result in the under-reporting of energy consumption and thus cause a loss of revenue to the utility.

To perform the current angle diagnostic, the controller 108 determines whether each phase current angle is within an acceptable deviation from the expected or nominal value. The nominal value for each phase current is typically equal to the phase voltage nominal phase angle. Variance from the current phase angle and the voltage phase angle is referred to in the art as lead and lag. As discussed above, some amount of lead or lag is to be expected under normal metering conditions. To determine whether the current angles are within acceptable limits, the controller 108 compares each current phase angle to its maximum acceptable lead and lag displacement. Lead displacement is defined as the corresponding voltage phase angle for the corresponding phase plus an amount of acceptable lead angle, for example, 60°. Lag displacement is defined as the corresponding voltage phase angle minus an amount of acceptable lag angle, for example, 30°.

For example, for phase B in a four wire wye configuration, the corresponding voltage phase angle is 120°. With the exemplary lead and lag angles discussed above, the lead displacement would be 180°, and the lag displacement would be 90°.

In any event, to carry out the diagnostic, the controller 108 determines, in order: whether $I<_A$ is less than or equal to its lag displacement (step 802); whether $I<_A$ is greater than or equal to its lead displacement (step 804); whether $I<_B$ is less than or equal to its lag displacement (step 806); whether $I<_B$ is greater than or equal to its lead displacement (step 808); whether $I<_C$ is less than or equal to its lag displacement (step 810); and whether $I<_C$ is greater than or equal to its lead displacement (step 812). If in any of the steps 802, 804, 806, 808, 810, or 812, then the controller determines that a measured current phase angle is not within acceptable variation from the nominal value, then the controller 108 proceeds to step 814. Otherwise, if the controller 108 determines that all measured current angles values are acceptable, then the controller exits the diagnostic (step 816).

In step 814, the controller sets a flag or signal that indicates that a current angle measurement error exists. The controller 108 then exits the diagnostic (step 816).

Figure 9:
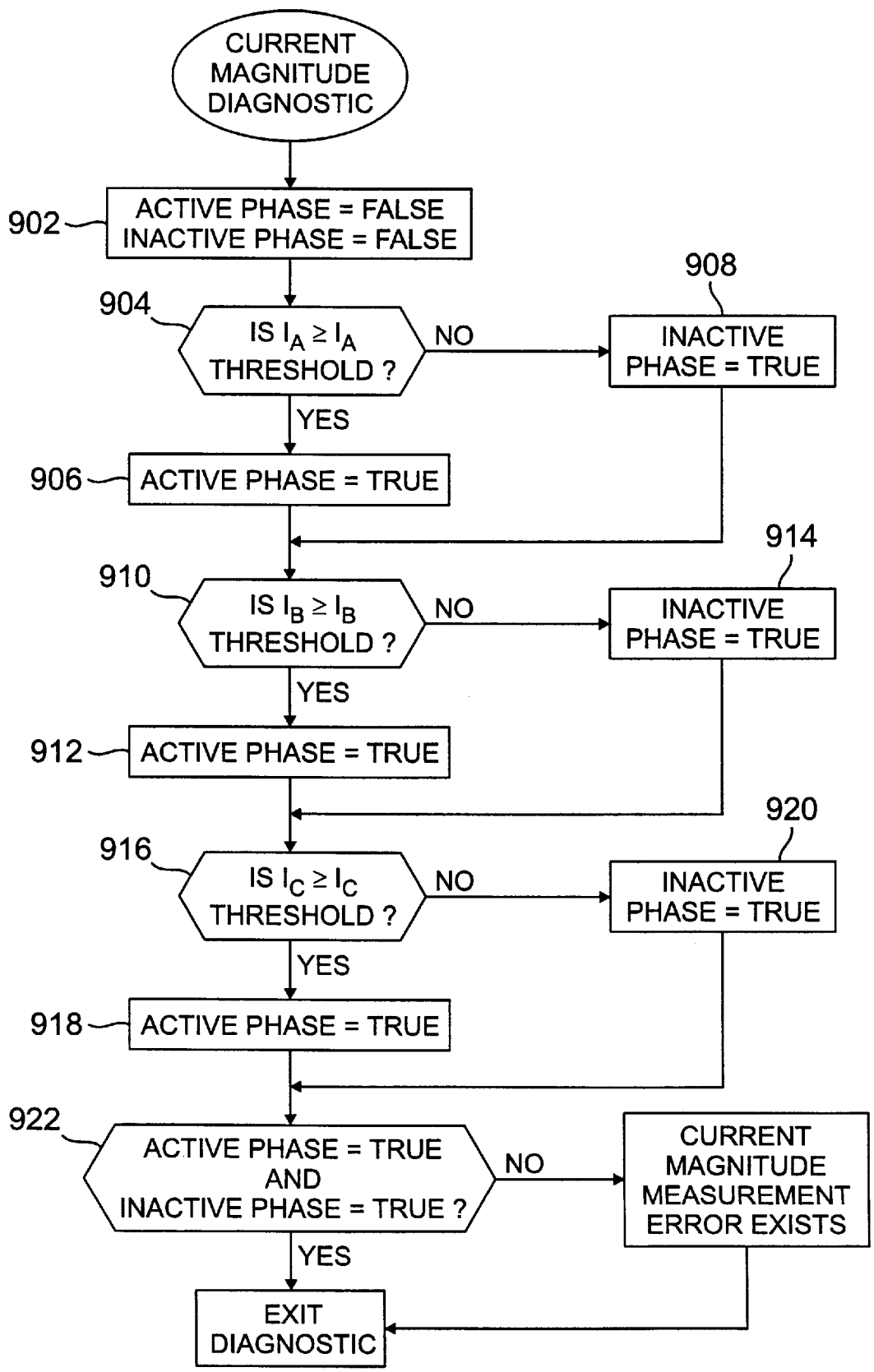
FIG. 9 shows a flow diagram of an exemplary current magnitude diagnostic performed by the controller of FIG. 4.

FIG. 9 shows a flow diagram of steps performed by the controller 108 to carry out a current magnitude diagnostic. A current magnitude diagnostic essentially determines if one of the current sensors is detecting no current while the other current sensors are detecting current. If one of the sensors is not detecting current, then it is possible that the current sensor within the meter has failed, or that the meter has been tampered with. For example, a common meter tampering method is to "shunt" a current sensor, which provides a path for the load current that avoids measurement by utility meter. If the current sensor for one of the phases is "shunted", the energy consumption measurements for that phase will be negligible, resulting in a loss of revenue for the utility.

In FIG. 9, the controller basically determines if at least one phase current magnitude is over a lowlevel threshold while at least one phase current magnitude is above the low level threshold. If so, then a current magnitude measurement error is indicated. Contrariwise, if the current magnitudes for all the phases are below the low level threshold, then generally it is assumed that the customer is not consuming energy. In such a case, no current magnitude error is indicated. Likewise, no current magnitude error is indicated if all the phases are above the low level threshold. The flow diagram in FIG. 9 shows the steps performed by the controller 108 to carry out the above method.

In step 902, binary variables ACTIVE PHASE and INACTIVE PHASE are set equal to "false", or "0". The controller 108 then determines whether IRMSA is greater than the low level threshold (step 904). The low level threshold is typically the same for all three phases, and may suitably be equal to the anti-creep threshold, which is well-known to those of ordinary skill in the art. The anti-creep threshold, in general, represents near zero power consumption.

If IRMSA is greater than the threshold, then the controller 108 sets ACTIVE PHASE equal to "true" or "1" (step 906). If not, then the controller 108 sets INACTIVE PHASE equal to "true" or "1" (step 908). In either event, the controller 108 then proceeds to determine whether IRMSB is greater than the threshold (step 9 10).

If IRMSB is greater than the threshold, then the controller 108 sets ACTIVE PHASE equal to "true" or "1" (step 912). If not, then the controller 108 sets INACTIVE PHASE equal to "true" or "1" (step 914). In either event, the controller 108 then proceeds to determine whether IRMSC is greater than the threshold (step 916).

If IRMSC is greater than the threshold, then the controller 108 sets ACTIVE PHASE equal to "true" or "1" (step 918). If not, then the controller 108 sets INACTIVE PHASE equal to "true" or "1" (step 920). In either event, the controller 108 then proceeds to determine whether both ACTIVE PHASE and INACTIVE PHASE are equal to "true" or "1" (step 922). If both ACTIVE PHASE=true and INACTIVE PHASE=true, then the controller 108 sets a flag or signal that indicates that a current magnitude measurement error exists (step 924). The controller 108 then exits the diagnostic (step 926). If, in step 922, it is determined that either of ACTIVE PHASE and INACTIVE PHASE are equal to "false" or "0", then no measurement error is indicated and the controller 108 exits the diagnostic.

Other diagnostics, such as current imbalance and energy flow diagnostics may readily be incorporated by those of ordinary skill in the art. Moreover, other methods of carrying out the diagnostics set forth in FIGS. 6 through 9 may be incorporated and still benefit from many of the advantages of the present invention.

In general, it will be noted that the above described embodiments are merely illustrative. Those of ordinary skill in the art may readily devise their own implementations that incorporate the principles of the present invention and fall within the spirit and scope thereof.

We claim:

1. An electrical utility meter operably connected to a plurality of power lines through a meter socket, the plurality of power lines providing polyphase power to a load, the electrical utility meter operable to measure electrical energy consumption, the electrical utility meter comprising:

a) sensor circuitry for connection to the meter socket, said sensor circuitry operable to generate voltage and current measurement signals representative of voltage and current waveforms on the plurality of power lines;

b) a conversion circuit for generating a power consumption measurement and for generating measured phase angle data for the plurality of power lines, said generation of the power consumption measurement and measured phase angle data based on the voltage and current measurement signals;

c) a memory;

d) a communication circuit connected to a remotely located control device;

e) a controller operably connected to the memory, the communication circuit, and the conversion circuit, the controller operable to receive the measured phase angle data from the conversion circuit, periodically perform a plurality of diagnostic tests using the measured phase angle data to determine whether the measurement error is present, provide an alert signal to the communication circuit if a measurement error is present, and wherein said communication circuit is operable to, upon receiving the alert signal, obtain information identifying the measurement error and transmit an error signal containing information identifying the measurement error to the remotely located control device.

2. The electrical utility meter of claim 1 wherein said controller is further operable to identify the measurement error and store information identifying the measurement error in the memory, and wherein said communication circuit is further operable to obtain information identifying the measurement error from the memory.

3. The electrical utility meter of claim 1 wherein said communication device is operable to, after obtaining information identifying the measurement error, determine whether to transmit the information identifying the measurement error based on the information identifying the measurement error and one or more predefined parameters, and transmit the error signal if the communication circuit determines that the information identifying the measurement error is to be transmitted.

4. The electrical utility meter of claim 1 wherein said communication circuit further comprises a processor connected to said controller, said processor operable to control the operations of the communication circuit.

5. The electrical utility meter of claim 4 wherein the communication circuit further comprises a modem operably connected to receive the information identifying the measurement error, the modem operable to transmit the error signal identifying the measurement error to the remotely located control device using a telephone line.

6. An arrangement for use in an electrical utility meter operably connected to a plurality of power lines through a meter socket, the plurality of power lines providing power to a load, the meter operable to measure electrical energy consumption, the arrangement comprising:
  a) a source of measured data comprising at least one of measured phase angle data corresponding to the plurality of power lines and measured magnitude data corresponding to the plurality of power lines;
  b) a communication circuit connected to a remotely located control device;
  c) a controller operably connected to the communication circuit and the source of measured data, the controller operable to
    receive measured data corresponding to the plurality of power lines,
    periodically perform a plurality of diagnostic tests using the measured data to determine whether a measurement error is present, and
    cause the communication circuit to transmit an error signal containing information identifying the measurement error to the remotely located control device if the measurement error is present.

7. The arrangement of claim 6 wherein the controller is further operably to cause the communication circuit to transmit the error signal by providing an alert signal to the communication circuit if the measurement error is present, and wherein the communication circuit, upon receiving the alert signal, is operable to obtain information identifying the measurement error and transmit the error signal identifying the measurement error to the remotely located control device.

8. The arrangement of claim 6 further comprising a memory connected to the controller, said memory containing nominal data comprising at least one of nominal phase angle data corresponding to the plurality of power lines and nominal magnitude data corresponding to the plurality of power lines, and wherein said controller is further operable to retrieve at least a portion of the nominal data and periodically perform the plurality of diagnostic tests using the measured data and the retrieved portion of nominal data to determine whether the measurement error is present.

9. The arrangement of claim 6 wherein the source of measured data includes a source of measured phase angle data corresponding to the plurality of power lines, and wherein the controller is further operable to receive the measured phase angle data and periodically perform the plurality of diagnostic tests using the measured phase angle data.

10. The arrangement of claim 9 further comprising a memory connected to the controller, said memory containing nominal phase angle data corresponding to the plurality of power lines, and wherein said controller is further operable to retrieve at least a portion of the nominal phase angle data and periodically perform the plurality of diagnostic tests using the measured phase angle data and the retrieved portion of nominal phase angle data to determine whether the measurement error is present.

11. The arrangement of claim 9 further comprising a source of measured magnitude data corresponding to the plurality of power lines, and wherein the controller is further operable to receive the measured magnitude data and periodically perform the plurality of diagnostic tests using the measured phase angle data and the measured magnitude data to determine whether the measurement error is present.

12. The arrangement of claim 11 further comprising a memory connected to the controller, said memory containing nominal phase angle and magnitude data corresponding to the plurality of power lines, and wherein said controller is further operable to retrieve at least a portion of the nominal phase angle and magnitude data and periodically perform the plurality of diagnostic tests using the measured phase angle data, the measured magnitude data, and the retrieved portion of nominal phase angle and magnitude data to determine whether the measurement error is present.

13. The arrangement of claim 6 wherein the source of measured data includes a source of measured voltage phase angle data corresponding to the plurality of power lines and measured current phase angle data corresponding to the plurality of power lines, and wherein the controller is further operable to receive the measured voltage phase angle data and the measured current phase angle data and periodically perform the plurality of diagnostic tests using the measured voltage phase angle data and the measured current phase angle data.

14. The arrangement of claim 13 further comprising a memory connected to the controller, said memory containing nominal voltage and current phase angle data corresponding to the plurality of power lines, and wherein said controller is further operable to retrieve at least a portion of the nominal voltage and current phase angle data and periodically perform the plurality of diagnostic tests using the measured voltage phase angle data, the measured current phase angle data, and the retrieved portion of nominal voltage and current phase angle data to determine whether the measurement error is present.

15. The arrangement of claim 6 wherein the source of measured data includes a source of measured magnitude data corresponding to the plurality of power lines, and wherein the controller is further operable to receive the measured magnitude data and periodically perform the plurality of diagnostic tests using the measured magnitude data.

16. The arrangement of claim 15 further comprising a memory connected to the controller, said memory containing nominal magnitude data corresponding to the plurality of power lines, and wherein said controller is further operable to retrieve at least a portion of the nominal magnitude data and periodically perform the plurality of diagnostic tests using the measured magnitude data and the retrieved portion of nominal magnitude data to determine whether the measurement error is present.

17. The arrangement of claim 6 wherein said communication circuit further comprises a processor connected to said controller, said processor operable to control the operations of the communication circuit.

18. The arrangement of claim 17 wherein the controller further causes the communication circuit to transmit the error signal by providing an alert signal to the processor if the measurement error is present, and wherein the processor is operable to, upon receiving the alert signal, obtain information identifying the measurement error and transmit the error signal identifying the measurement error to the remotely located control device.

19. The arrangement of claim 17 wherein the communication circuit further comprises a modem connected to receive the information identifying the measurement error and is operable to transmit the error signal identifying the measurement error to the remotely located control device using a telephone line.

20. The arrangement of claim 17 wherein the processor is further operable to:
  obtain information identifying the measurement error;
  determine whether to transmit the information identifying the measurement error based on the one or more predefined parameters and the information identifying the measurement error; and
  cause the communication circuit to transmit the error signal if it is determined that the information identifying the measurement error is to be transmitted.

21. The arrangement of claim 18 wherein the processor includes an idle state and an active state and wherein said processor changes from the idle state to the active state upon reception of the alert signal.

22. A method of performing diagnostics in an electrical utility meter connected to a plurality of power lines through a meter socket, the electrical utility meter comprising a communication circuit, a controller, and a source of measured data comprising at least one of measured phase angle data corresponding to the plurality of power lines and measured magnitude data corresponding to the plurality of power lines, the method comprising:

a) providing the measured data to the controller;

b) using the controller to periodically perform a plurality of diagnostic tests using the measured data to determine whether a measurement error is present; and c) using the communication circuit to transmit an error signal containing information identifying the measurement error to a remotely located control device if the measurement error is present.

23. The method of claim 22 further comprising, after step b), the step of providing an alert signal to the communication circuit if the measurement error is present, and wherein step c) further comprises using the communication circuit, upon receiving the alert signal, to obtain information identifying the measurement error and transmit the measurement error to the remotely located control device.

24. The method of claim 22 wherein step b) further comprises periodically performing diagnostic tests using the measured data and nominal data retrieved from a memory.

25. The method of claim 22 wherein step a) further comprises providing the measured phase angle data, and step b) further comprises using the controller to periodically perform plurality of diagnostic tests using the measured phase angle data to determined whether the measurement error is present.

26. The method of claim 25 wherein step b) further comprises periodically performing diagnostic tests using the measured phase angle data and nominal phase angle data retrieved from a memory.

27. The method of claim 22 wherein step a) further comprises providing measured voltage phase angle data and measured current phase angle data to the controller and step b) further comprises using the controller to periodically perform the plurality of diagnostic tests using the measured voltage phase angle date and the measured current phase angle data to determine whether the measurement error is present.

28. The method of claim 27 wherein step b) further comprises periodically performing diagnostic tests using the measured voltage phase angle data, the measured current phase angle data, and nominal phase angle data retrieved from a memory.

29. The method of claim 22 wherein step a) further comprises providing measured magnitude data, and step b) further comprises using the controller to periodically perform the plurality of diagnostic tests using the measured magnitude data to determine whether the measurement error is present.

30. The method of claim 29 wherein step b) further comprises periodically performing diagnostic tests using the measured magnitude data and nominal magnitude data retrieved from a memory.

* * * * *